United States Patent
Hayashi

(10) Patent No.: US 6,178,110 B1
(45) Date of Patent: Jan. 23, 2001

(54) STATIC SEMICONDUCTOR MEMORY DEVICE CAPABLE OF ENHANCING ACCESS SPEED

(75) Inventor: Fumihiko Hayashi, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/032,488

(22) Filed: Feb. 27, 1998

(30) Foreign Application Priority Data

Feb. 27, 1997 (JP) .................................................... 9-043423

(51) Int. Cl.$^7$ .................................................. G11C 11/00
(52) U.S. Cl. ......................... 365/154; 365/156; 257/903; 257/904
(58) Field of Search .................................. 365/154, 156; 257/903, 904

(56) References Cited

U.S. PATENT DOCUMENTS

| | | | |
|---|---|---|---|
| 5,331,170 | * 7/1994 | Hayashi | 257/377 |
| 5,535,155 | 7/1996 | Abe | 365/154 |
| 5,734,179 | * 3/1998 | Chang et al. | 257/67 |
| 5,774,393 | * 6/1998 | Kuriyama | 365/156 |

FOREIGN PATENT DOCUMENTS

| | | |
|---|---|---|
| 4-320371 | 11/1992 | (JP) . |
| 7-202032 | 8/1995 | (JP) . |
| 8-274190 | 10/1996 | (JP) . |

* cited by examiner

*Primary Examiner*—David Nelms
*Assistant Examiner*—Hoai V. Ho
(74) *Attorney, Agent, or Firm*—Foley, Hoag & Eliot LLP

(57) ABSTRACT

In a static memory cell including first and second drive MOS transistors, first and second MOS transfer transistors and first and second load elements, the drain of the first drive MOS transistor and the source of the first transfer MOS transistor are formed by a first impurity region in a semiconductor substrate, and the drain of the second drive MOS transistor and the source of the second transfer MOS transistor are formed by a second impurity region in the semiconductor substrate. Also, a first metal silicide layer is formed on the first impurity region and the gate of the second drive MOS transistor, and a second metal silicide layer is formed on the second impurity region and the gate of the the drive MOS transistor. Further, the first and second load elements are formed on the first and second metal silicide layers, respectively.

14 Claims, 18 Drawing Sheets

Fig. 2 PRIOR ART
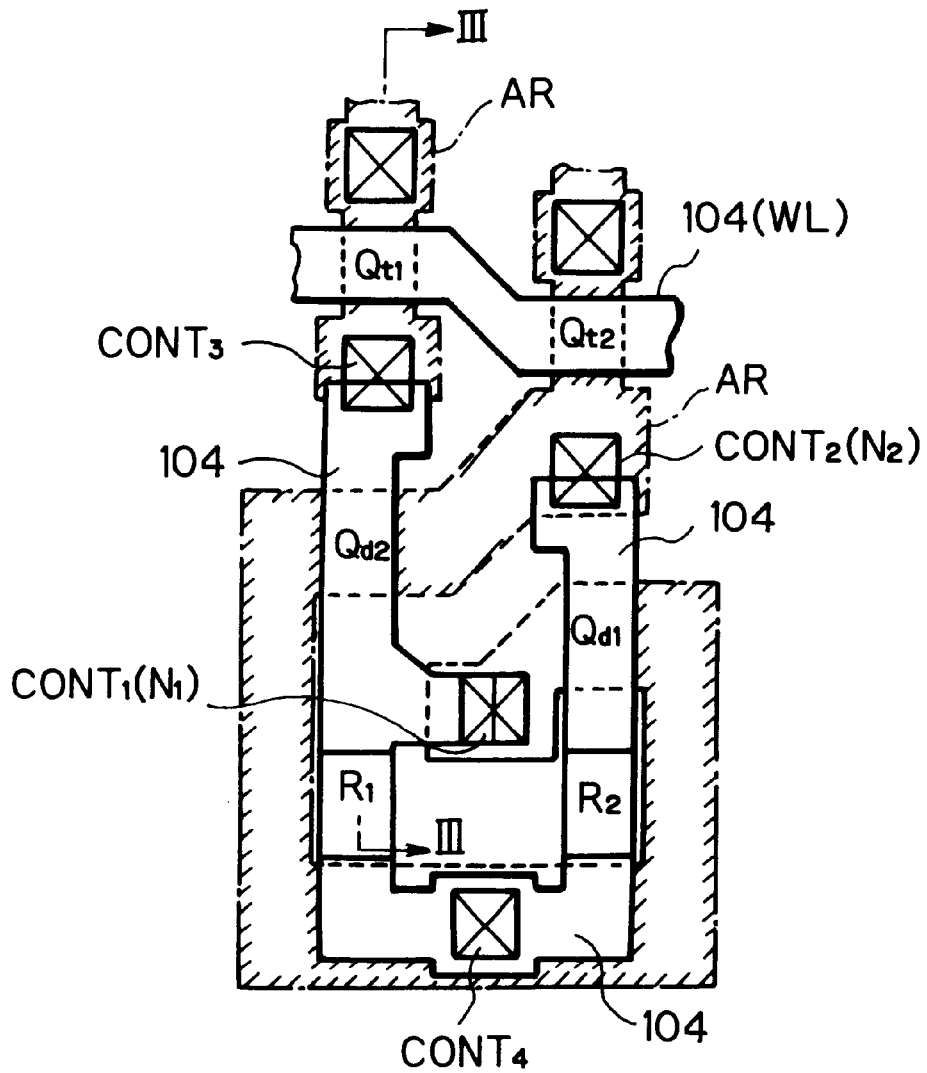
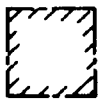
N-TYPE IMPURITY DIFFUSION REGIONS 106 & 109

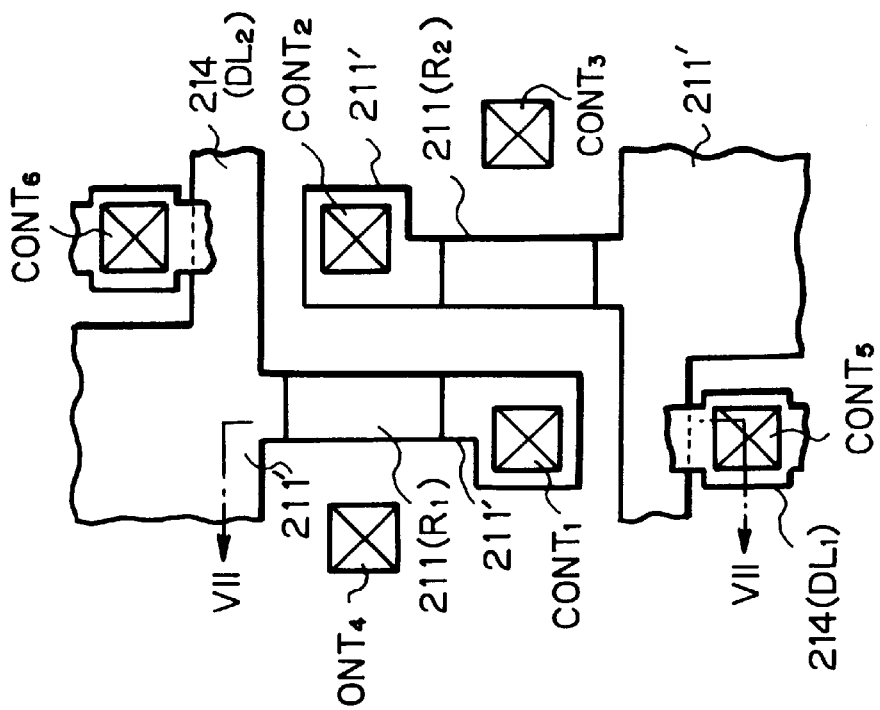
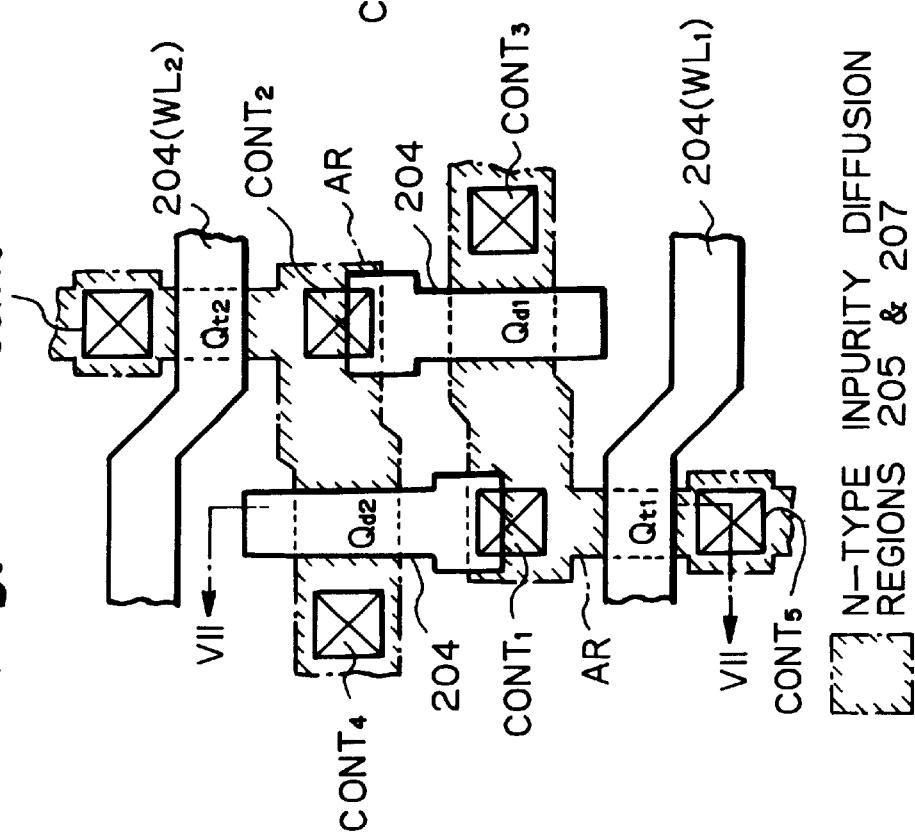

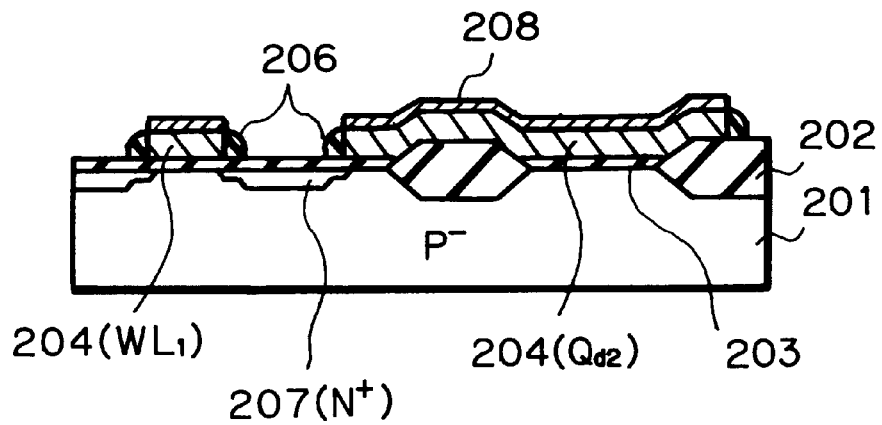
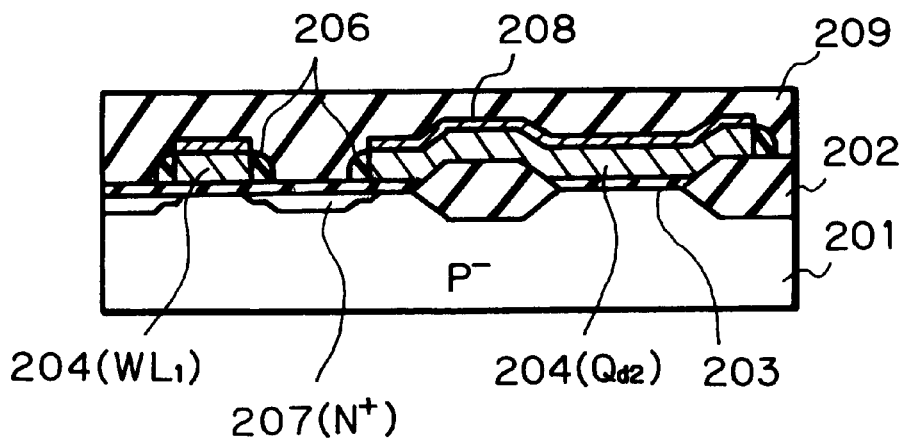
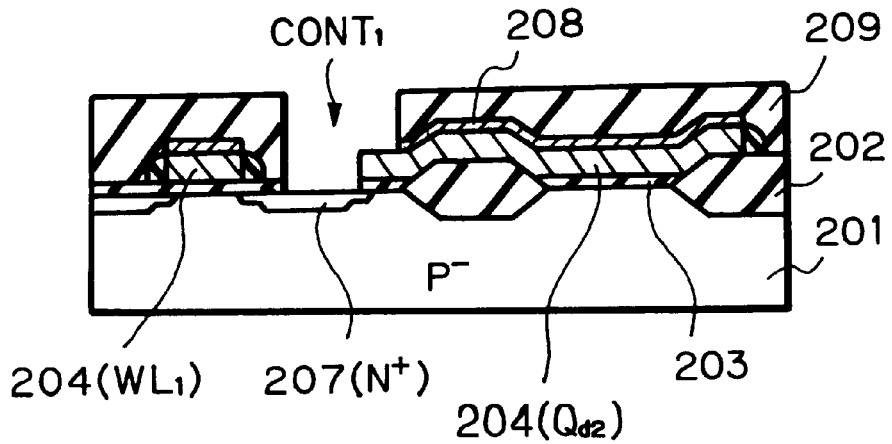

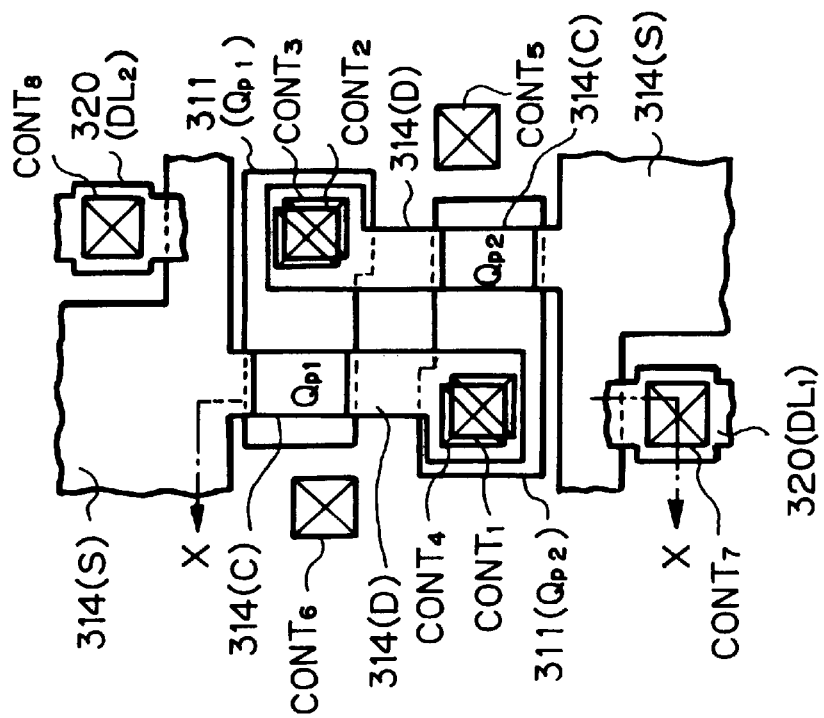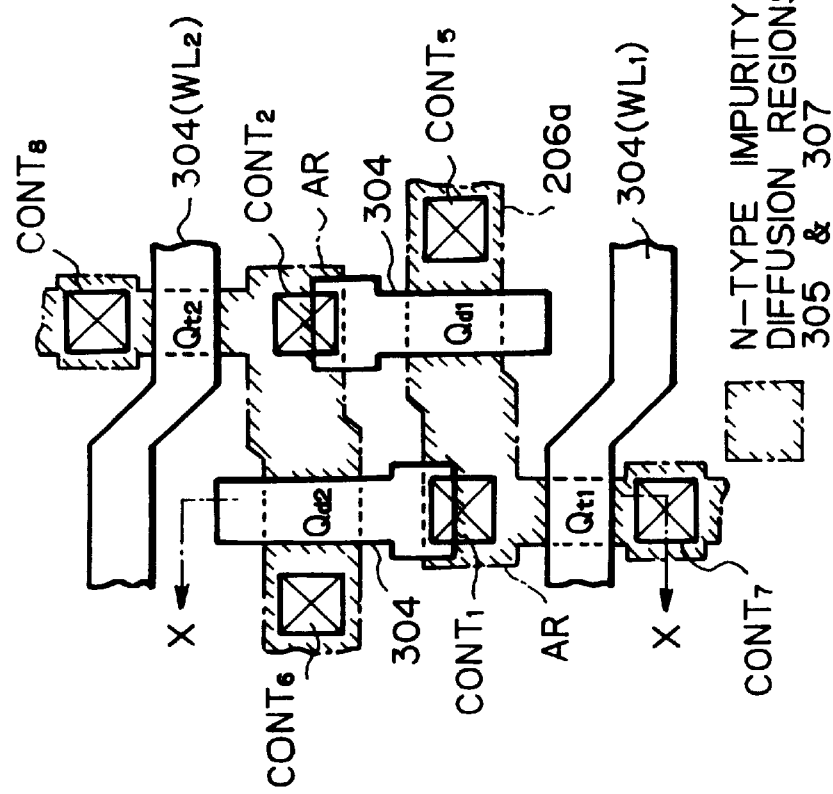

STATIC SEMICONDUCTOR MEMORY DEVICE CAPABLE OF ENHANCING ACCESS SPEED

BACKGROUND OF THE INVENTION

1. Field of the Invention

The present invention relates to a static semiconductor memory device, and more particularly, to the improvement of a static random access memory (SRAM) cell.

2. Description of the Related Art

A prior art SRAM cell is constructed by a flip-flop formed by cross-coupled first and second inverters and transfer transistors connected between first and second nodes of the flip-flop and data lines. That is, the first inverter is formed by a first load resistor between a power supply line and the first node and a drive MOS transistor between the first node and a ground line. Similarly, the second inverter is formed by a second load resistor element between the power supply line and the second node and a second drive MOS transistor between the second node and the ground line. In this SRAM cell, in order to increase the access speed, a salidation technology has been adopted. For example, the gate electrodes are constructed by a double configuration made of polycrystalline silicon and metal silicide. This will be explained later in detail.

In the above-described prior art SRAM cell however, since the load resistors are formed on the same plane as the gates of the drive transistors and the transfer transistors, the area of the SRAM cell is increased, which is disadvantageous in terms of integration.

If the load resistor is formed over the gates of the drive transistors, a parasitic resistance between the gate of the drive transistor and the source of the transfer transistor at the node is increased, thus remarkably decreasing the access speed of the SRAM cell. This also will be explained later in detail.

SUMMARY OF THE INVENTION

It is an object of the invention to enhance the access speed of an SRAM cell as well as improve the integration thereof.

According to the present invention, in a static memory cell including first and second drive MOS transistors, first and second MOS transfer transistors and first and second load elements, the drain of the first drive MOS transistor and the source of the first transfer MOS transistor are formed by a first impurity region in a semiconductor substrate, and the drain of the second drive MOS transistor and the source of the second transfer MOS transistor are formed by a second impurity region in the semiconductor substrate. Also, a first metal silicide layer is formed on the first impurity region and the gate of the second drive MOS transistor, and a second metal silicide layer is formed on the second impurity region and the gate of the drive MOS transistor. Further, the first and second load elements are formed on the first and second metal silicide layers, respectively.

Thus, since the load elements are formed on a different plane from that of the transfer transistors and the drive transistors, the size of the SRAM cell can be reduced. Also, since the metal silicide layers are formed at the contact nodes, the parasitic resistance thereof can be reduced, thus increasing the access speed of the SRAM cell.

BRIEF DESCRIPTION OF THE DRAWINGS

The present invention will be more clearly understood from the description as set forth below, as compared with the prior art, with reference to the accompanying drawings, wherein:

FIG. 2 is a plan view of the SRAM cell of FIG. 1;

FIGS. 6A and 6B are plan views of the SRAM cell of FIG. 5;

FIGS. 7A through 7J are cross-sectional views of the SRAM cell of FIGS. 6A and 6B;

FIGS. 9A and 9B are plan views of the SRAM cell of FIG. 8; and

DESCRIPTION OF THE PREFERRED EMBODIMENTS

Before the description of the preferred embodiments, a prior art SRAM cell will be explained with reference to FIGS. 1, 2, 3A through 3H and 4.

Figure 1:
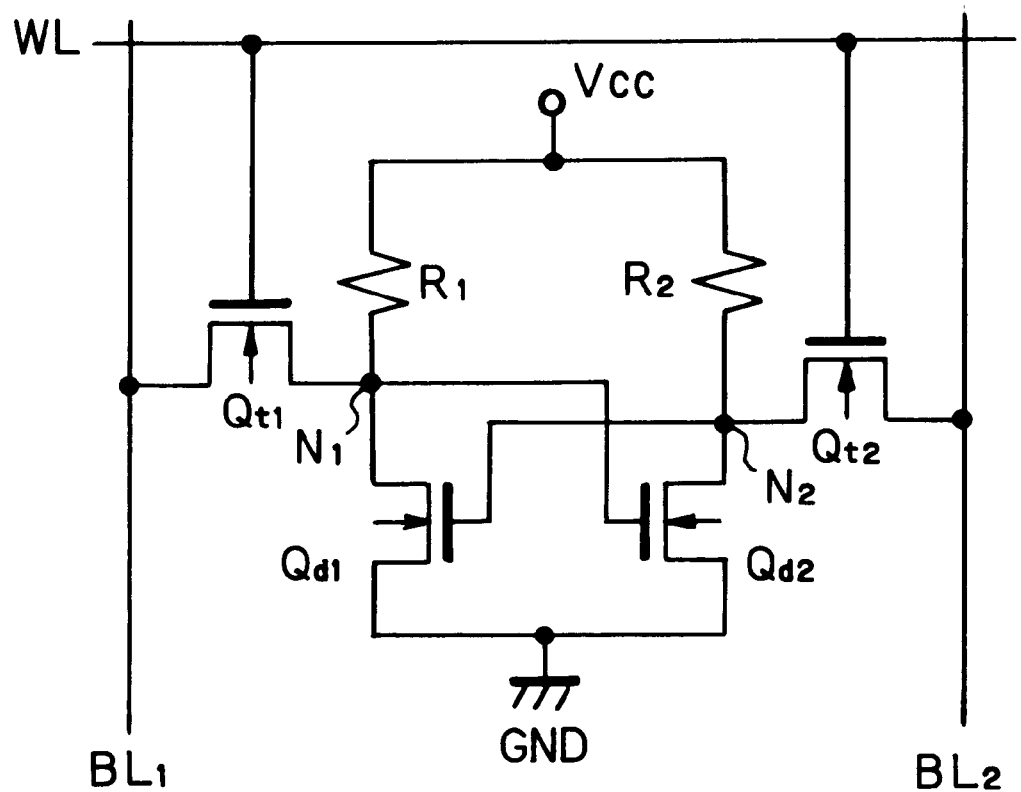
FIG. 1 is an equivalent circuit diagram illustrating a first prior art SRAM cell.

In FIG. 1, which is an equivalent circuit diagram illustrating the prior art SRAM cell, one SRAM is provided at each intersection between a word line WL and two complementary bit lines $BL_1$ and $BL_2$. The memory cell is constructed by a flip-flop formed by two cross-coupled inverters and transfer N-channel MOS transistors $Q_{t1}$ and $Q_{t2}$ connected between nodes $N_1$ of the flip-flop and bit lines $BL_1$ and $BL_2$. The transfer transistors $Q_{t1}$ and $Q_{t2}$ are controlled by the voltage at the word line WL.

Each of the inverters includes a load resistor $R_1$ ($R_2$) and a drive N-channel MOS transistor $Q_{d1}$ ($Q_{d2}$) between a power supply line $V_{cc}$ and a ground line GND. The node $N_1$ is connected to a gate of the drive transistor $Q_{d2}$, so that the drive transistor $Q_{d2}$ is driven by the voltage at the node $N_1$. Also, the node $N_2$ is connected to a gate of the drive transistor $Q_{d1}$, so that the drive transistor $Q_{d1}$ is driven by the voltage at the node $N_1$.

FIG. 2 is a plan view of the SRAM cell of FIG. 1, and FIGS. 3A through 3H are cross-sectional views taken along the line III—III of FIG. 2. Note that the SRAM cell as illustrated in FIG. 2 is asymmetrical.

The structure of the SRAM cell of FIG. 1 is explained next with reference to FIGS. 3A through 3H which show manufacturing steps thereof, as well as FIG. 2.

Figure 3A:
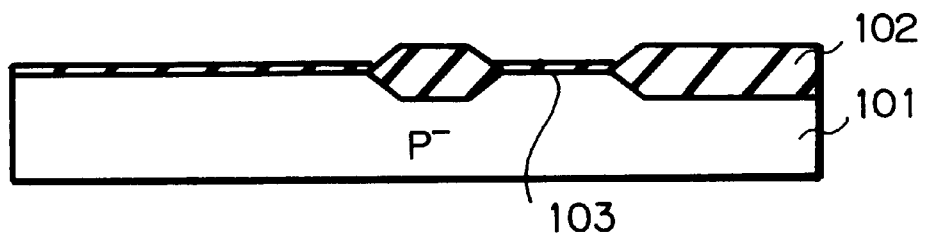
FIGS. 3A through 3H are cross-sectional views of the SRAM cell of FIG. 2.

First, referring to FIG. 3A, a P-type monocrystalline silicon substrate 101 is thermally oxidized by a local oxidation of silicon (LOCOS) process to form an about 600 nm thick field silicon oxide layer 102. As a result, an active area AR (see FIG. 2) is surrounded by the field silicon oxide layer 102. Then, an about 20 nm thick gate silicon oxide layer 103 is grown by thermally oxidizing the substrate 101.

Figure 3B:
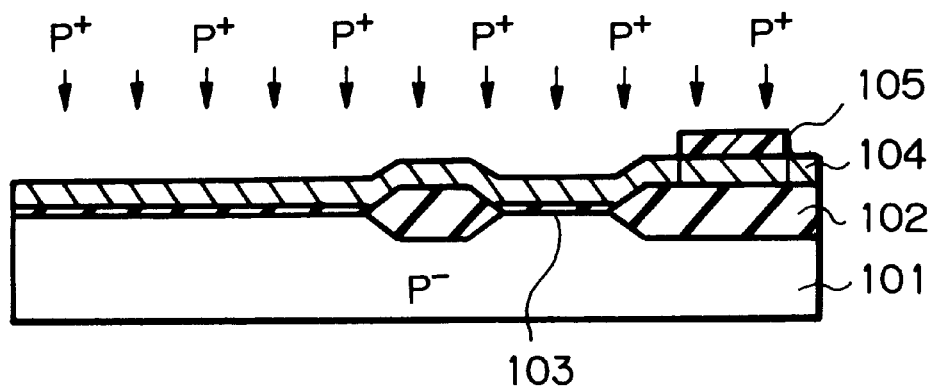

Next, referring to FIG. 3B, an about 300 nm thick undoped polycrystalline silicon layer 104 is deposited on the entire surface by a chemical vapor deposition (CVD) process. Then, a photoresist pattern 105 is formed, and about $10^{15}$ phosphorus ions per $cm^2$ are implanted at an energy of about 30 keV. As a result, the resistance values of portions of the polycrystalline silicon layer 104 beneath the photoresist pattern 105 corresponding to the load resistors $R_1$ and $R_2$ remain high, while the resistance values of the other portion becomes low. Then, the photoresist pattern 105 is removed.

Figure 3C:
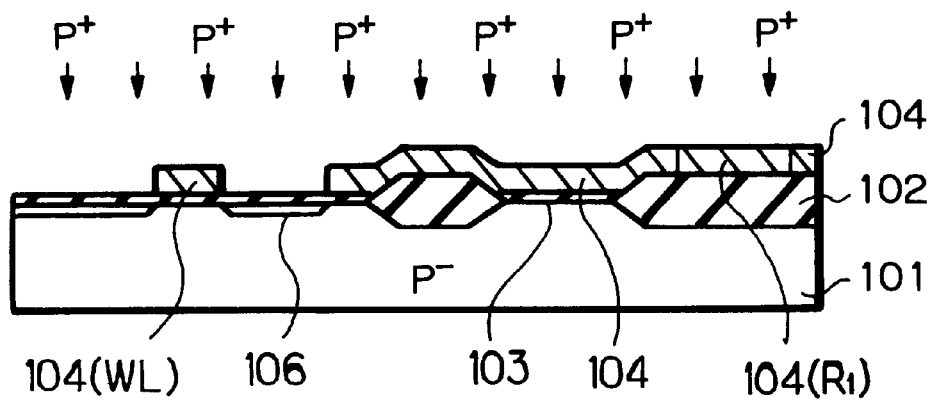

Next, referring to FIG. 3C, the polycrystalline silicon layer 104 is patterned by a photolithography process, so that the word line WL (i.e., the gates of the transfer transistors $Q_{t1}$ and $Q_{t2}$), the load resistors $R_1$ and $R_2$ and the gates of the drive transistors $Q_{d1}$ and $Q_{d2}$ are formed (see FIG. 2). Then, about $2 \times 10^{13}$ phosphorus ions per cm$^2$ at an energy of about 10 keV are implanted into the substrate 101 using the polycrystalline silicon layer 104 and the field silicon oxide layer 102 as a mask, so that N$^-$-type impurity diffusion regions 106 of a lightly-doped drain (LDD) configuration are formed.

Figure 3D:
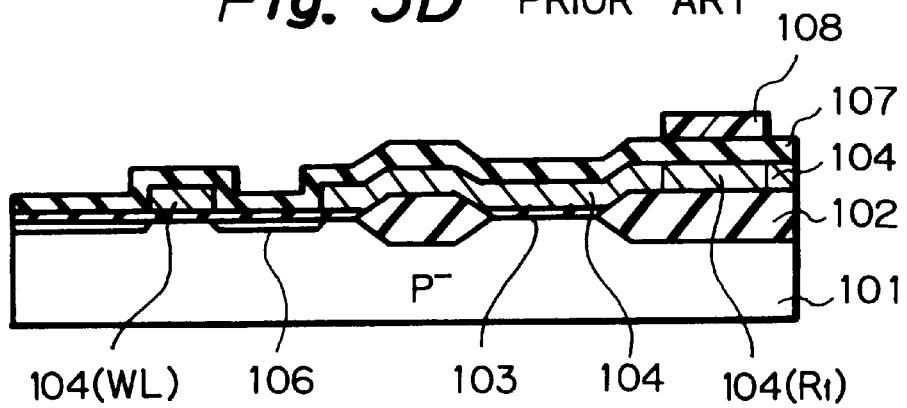

Next, referring to FIG. 3D, an about 150 nm thick silicon oxide layer 107 is deposited on the entire surface by a CVD process. Then, a photoresist pattern 108 is formed.

Figure 3E:
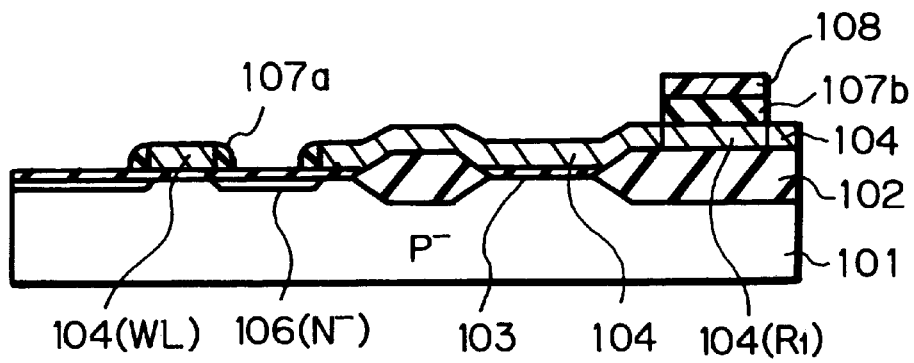

Next, referring to FIG. 3E, the silicon oxide layer 107 is etched back by an anisotropic process to form a sidewall silicon oxide layer 107a. In this case, the silicon oxide layer 107 is left as a silicon oxide layer 107 beneath the photoresist pattern 108. Then, the photoresist pattern 108 is removed.

Figure 3F:
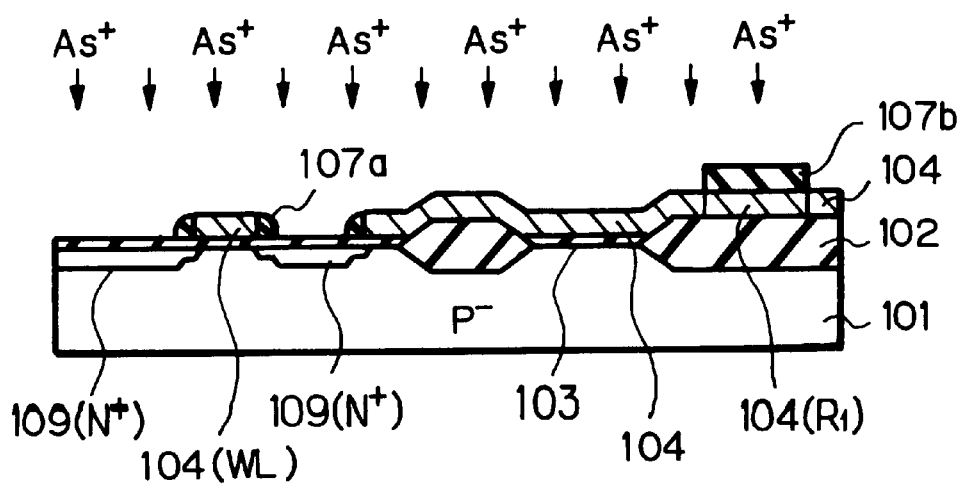

Next, referring to FIG. 3F, about $4 \times 10^{15}$ arsenic ions per cm$^2$ are implanted into the substrate 101 by using the sidewall silicon oxide layer 107a as a mask to form N$^+$-type impurity diffusion regions 109 of the LDD configuration (see FIG. 2). In this case, the load resistor $R_1$ ($R_2$) of the polycrystalline silicon layer 104 is not subjected to the arsenic ions, so that the resistance value of the load resistor $R_1$ ($R_2$) remains high.

Figure 3G:
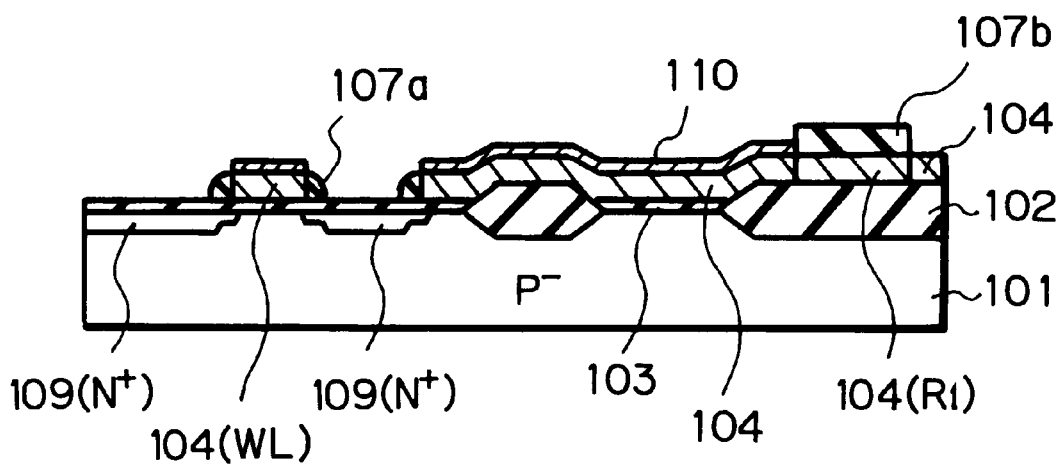

Next, referring to FIG. 3G, an about 50 to 60 nm thick titanium layer is deposited on the entire surface by a sputtering process. Then, a heating operation is performed upon the titanium layer at a temperature of about 650° C. for about 30 seconds, so that the titanium layer is reacted with the polycrystalline silicon layer 104. Then, the unreacted portion of the titanium layer is removed by an alkali solution such as ammonia water/hydrogen peroxide water mixture (SPM). As a result, a titanium silicide layer 110 is formed only on the polycrystalline silicon layer 104. Then, a heating operation is carried out at a temperature of about 760° C. for about 20 seconds to decrease the resistance of the titanium layer 110. Note that, if such a heating operation is carried out at a too high temperature for a longer time period than about 20 seconds, the titanium layer 110 may agglomerate, so that the resistance thereof increases.

Figure 3H:
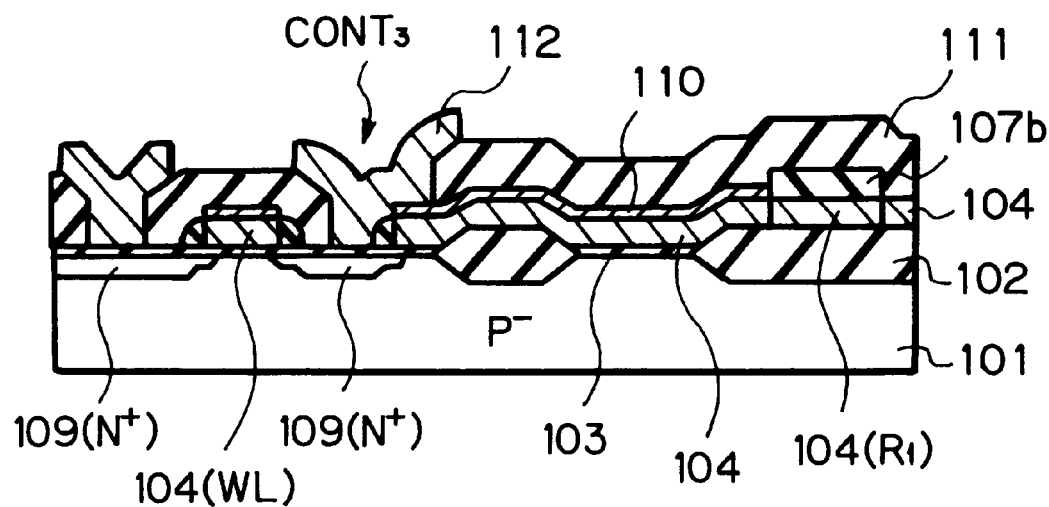

Finally, referring to FIG. 3H, a silicon oxide layer 111 is deposited on the entire surface by a CVD process. Then, contact holes CONT$_1$, CONT$_2$, CONT$_3$ and CONT$_4$ are perforated in the silicon oxide layer 111 (see FIG. 2). Then, an aluminum layer is deposited and patterned to form a electrode pattern 112. Note that the contact hole CONT$_1$ is used for the node N$_1$, the contact hole CONT$_2$ is used for the node N$_2$, the contact hole CONT$_3$ is used for connecting the gate (the node N$_1$) of the drive transistor $Q_{d2}$ to the source of the transfer transistor $Q_{t1}$, and the contact hole CONT$_4$ is used for a power supply line V$_{cc}$ (not shown).

Thus, the SRAM cell of FIG. 2 is completed.

In the above-described SRAM cell as illustrated in FIGS. 2 and 3A through 3H, however, since the load resistors $R_1$ and $R_2$ are formed on the same plane as the gates of the transistors $Q_{t1}$, $Q_{t2}$, $Q_{d1}$ and $Q_{d2}$, the area of the SRAM cell is increased, which is disadvantageous in terms of integration.

Figure 4:
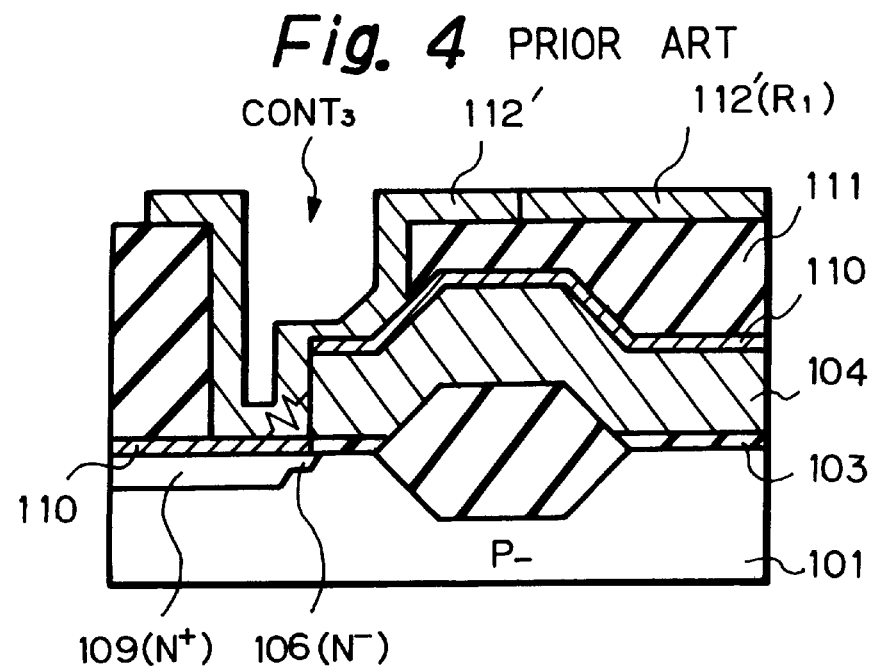
FIG. 4 is an equivalent circuit diagram illustrating a second prior art SRAM cell.

If the load resistor $R_1$ ($R_2$) is formed over the gates of the transistors $Q_{t1}$, $Q_{t2}$, $Q_{d1}$ and $Q_{d2}$, a low-resistance polycrystalline silicon layer 112' and a high-resistance polycrystalline silicon layer 112' ($R_1$) as illustrated in FIG. 4 can be provided instead of the aluminum electrode pattern 112 of FIG. 3H. That is, in FIG. 4, the polycrystalline silicon layer has a high concentration of impurities, and the polycrystalline silicon layer 112' ($R_1$) has a low concentration of impurities. In this case, however, when a heating operation for the titanium layer 110 is carried out, the resistance of the polycrystalline silicon layer 112' is increased in spite of including a high concentration of impurities. As a result, a parasitic resistance between the gate of the drive transistor $Q_{d2}$ ($Q_{d1}$) and the source of the transfer transistor $Q_{t1}$ ($Q_{t2}$) at the node N$_1$ (N$_2$) is increased, thus remarkably decreasing the access speed of the SRAM cell of FIG. 1.

Figure 5:
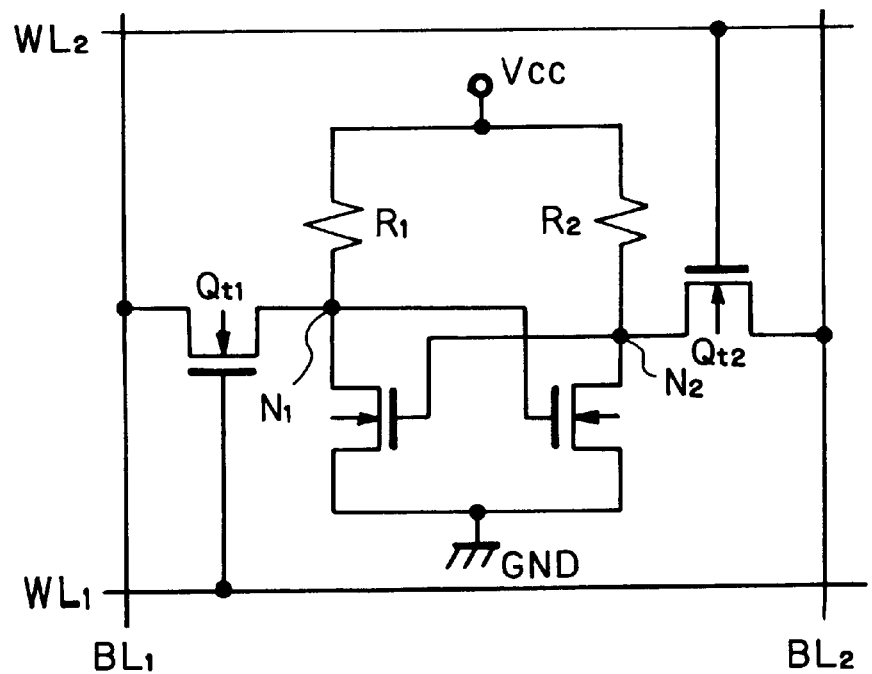
FIG. 5 is an equivalent circuit diagram illustrating a first embodiment of the SRAM cell according to the present invention.

In FIG. 5, which is an equivalent circuit diagram illustrating a first embodiment of the SRAM cell according to the present invention, two word lines WL$_1$ and WL$_2$ are provided instead of the word line WL of FIG. 1. That is, the transfer transistor $Q_{t1}$ is controlled by the voltage at the word line WL$_1$, and the transfer transistor $Q_{t2}$ is controlled by the voltage at the word line WL$_2$. In this case, note that the voltage at the word line WL$_1$ is the same as the voltage at the word line WL$_2$.

FIGS. 6A and 6B are plan views of the SRAM cell of FIG. 5, and FIGS. 7A through 7J are cross-sectional views taken along the line VII—VII of FIGS. 6A and 6B. Note that the SRAM cell as illustrated in FIGS. 6A and 6B is symmetrical.

The structure of the SRAM cell of FIG. 5 is explained next with reference to FIGS. 7A through 7J which show manufacturing steps thereof, as well as FIGS. 6A and 6B.

Figure 7A:
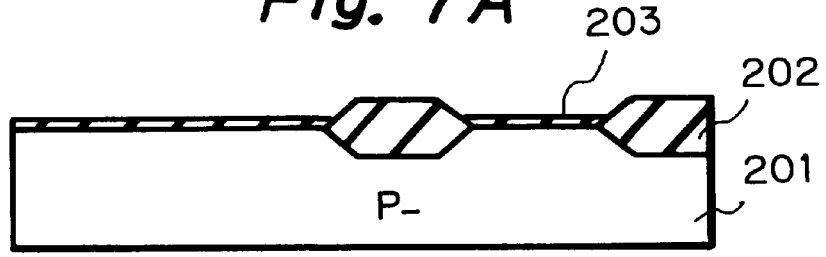

First, referring to FIG. 7A, a P-type monocrystalline silicon substrate 201 is thermally oxidized by a LOCOS process to form an about 400 nm thick field silicon oxide layer 202. As a result, an active area AR (see FIG. 6A) is surrounded by the field silicon oxide layer 202. Then, an about 10 nm thick gate silicon oxide layer 203 is grown by thermally oxidizing the substrate 201.

Figure 7B:
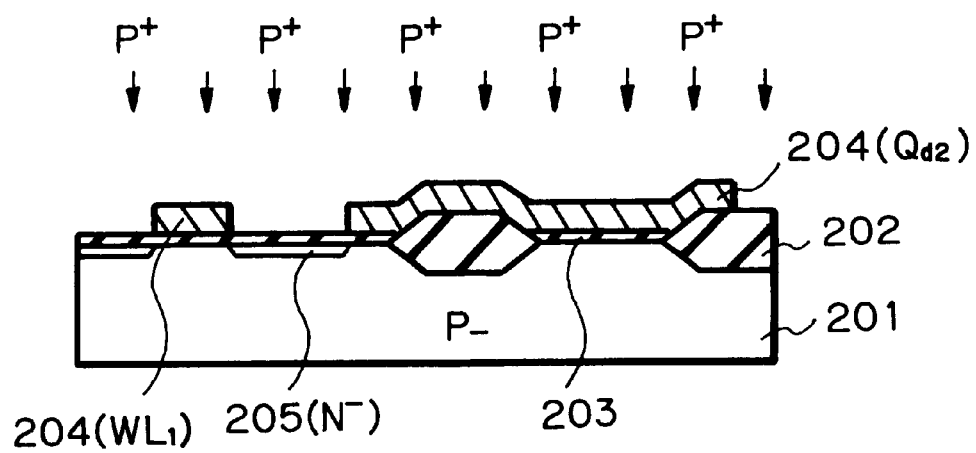

Next, referring to FIG. 7B, an about 300 nm thick N-type polycrystalline silicon layer 204 is deposited on the entire surface by a low pressure chemical vapor deposition (LPCVD) process. Then, the polycrystalline silicon layer 204 is patterned by a photolithography process and an anisotropic dry etching process, so that the word lines WL$_1$ and WL$_2$ (i.e., the gates of the transfer transistors $Q_{t1}$ and $Q_{t2}$) and the gates of the drive transistors $Q_{d1}$ and $Q_{d2}$ are formed (see FIG. 6A). Then, about $2 \times 10^{13}$ phosphorus ions per cm$^2$ at an energy of about 10 keV are implanted into the substrate 201 using the polycrystalline silicon layer 204 and the field silicon oxide layer 202 as a mask, so that N$^-$-type impurity diffusion regions 205 of an LDD configuration are formed.

Figure 7C:
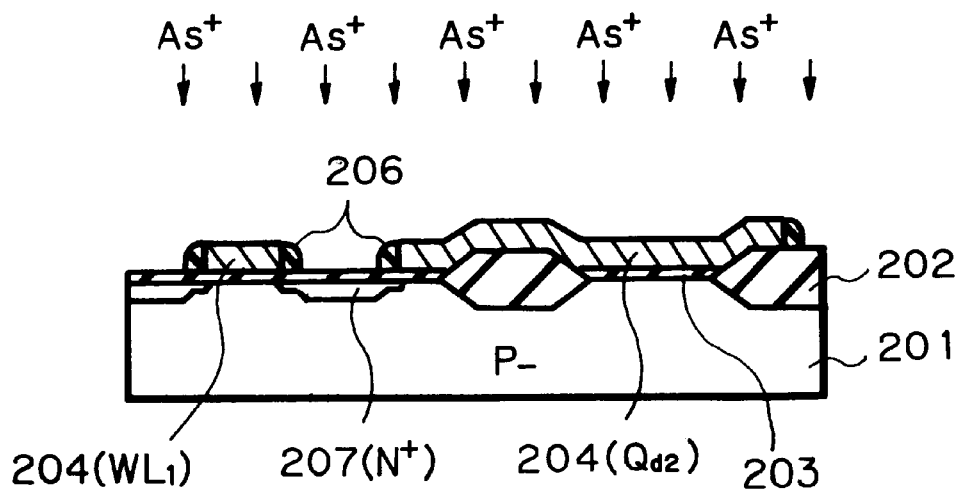

Next, referring to FIG. 7C, an about 100 nm thick silicon oxide layer is deposited on the entire surface by an LPCVD process. Then, the silicon oxide layer is etched back by a photolithography process and an anisotropic process to form a sidewall silicon oxide layer 206. Then, about $5 \times 10^{15}$ arsenic ions per cm$^2$ are implanted into the substrate 201 by using the sidewall silicon oxide layer 206 as a mask to form N$^+$-type impurity diffusion regions 207 of the LDD configuration which have an impurity concentration of about $10^{20}$ to $10^{21}$ per cm$^3$ (see FIG. 6A).

Next, referring to FIG. 7D, an about 50 to 60 nm thick titanium layer is deposited on the entire surface by a sputtering process. Then, a heating operation is performed upon the titanium layer at a temperature of lower than 700° C. such as about 650° C. for about 30 seconds, so that the titanium layer is reacted with the polycrystalline silicon layer 204. Then, the unreacted portion of the titanium layer is removed by an alkali solution such as SPM. As a result, a titanium silicide layer 208 is formed only on the polycrystalline silicon layer 204. Then, a heating operation is carried out at a temperature of higher than 800° C. for about 20 seconds to decrease the resistance of the titanium layer 208.

Next, referring to FIG. 7E, an insulating layer 209 is formed on the entire surface. That is, first, an about 100 nm thick silicon oxide layer is deposited by an atmospheric pressure chemical vapor deposition (APCVD) process. Then, an about 600 nm thick boron-included phosphorus silicated glass (BPSG) layer is deposited on the silicon oxide layer by an APCVD process. Then, after a heating operation at about 800° C. is carried out, a chemical mechanical polishing (CMP) process is performed upon the BPSG layer, to flatten it. Then, an about 100 nm thick silicon oxide layer is deposited on the flattened BPSG layer by an APCVD process, thus completing the insulating layer 209.

Next, referring to FIG. 7F, contact holes $CONT_1$ and $CONT_2$ are perforated in the insulating layer 209 (see FIG. 6A). In this case, in the contact holes $CONT_1$ and $CONT_2$, the gate silicon oxide layer 203 and the sidewall silicon oxide layer 206 are completely etched. However, note that the titanium silicide layer 208 within the contact holes $CONT_1$ and $CONT_2$ can be left by using a high etching ratio etching process of silicon oxide to titanium silicide.

Figure 7G:
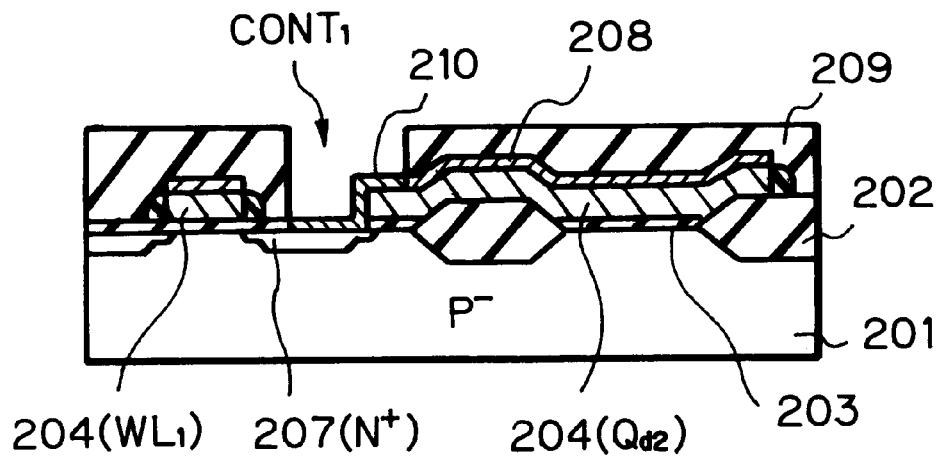

Next, referring to FIG. 7G, an about 50 to 60 nm thick titanium layer is deposited on the entire surface by a sputtering process. Then, a heating operation is performed upon the titanium layer at a temperature of lower than 700° C. such as about 650° C. for about 30 seconds, so that the titanium layer is reacted with the $N^+$-type impurity region 207 and the polycrystalline silicon layer 204 within the contact holes $CONT_1$ and $CONT_2$. Then, the unreacted portion of the titanium layer is removed by an alkali solution such as SPM. As a result, a titanium silicide layer 210 is formed only within the contact holes $CONT_1$ and $CONT_2$. Then, a heating operation is carried out at a temperature of higher than 800° C. for about 20 seconds to decrease the resistance of the titanium layer 210.

Figure 7H:
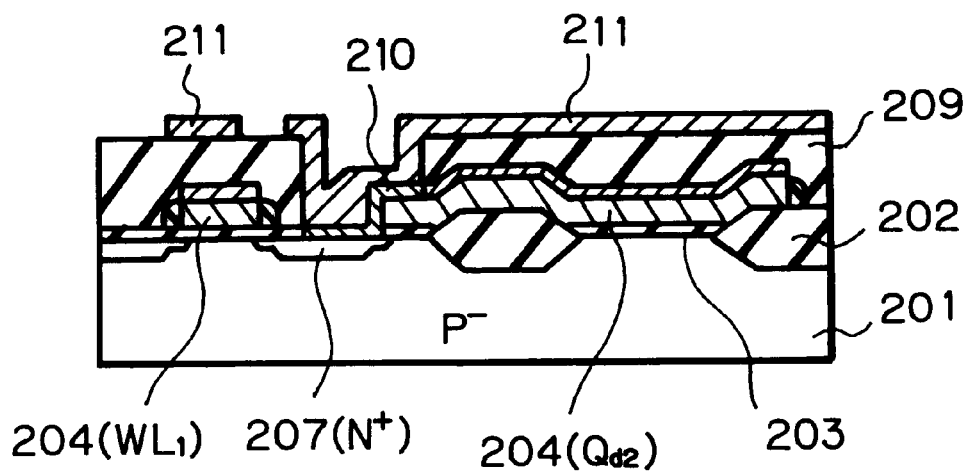

Next, referring to FIG. 7H, an about 50 to 100 nm thick polycrystalline silicon (or semi-insulating polycrystalline silicon (SIPOS)) layer is deposited on the entire surface by an LPCVD process. In this case, if the device is in an ammonia plasma atmosphere, nitride is grown on the titanium silicide layer 210, thus preventing active silicon and titanium silicide from reacting with each other when the polycrystalline silicon (or SIPOS) layer is grown. Then, after about $1 \times 10^{13}$ N-type impurity ions per $cm^2$ are implanted into the polycrystalline silicon (or SIPOS) layer, the latter is patterned by a photolithography process and an anisotropic dry etching process, to form a low impurity concentration polycrystalline silicon layer 211.

Figure 7I:
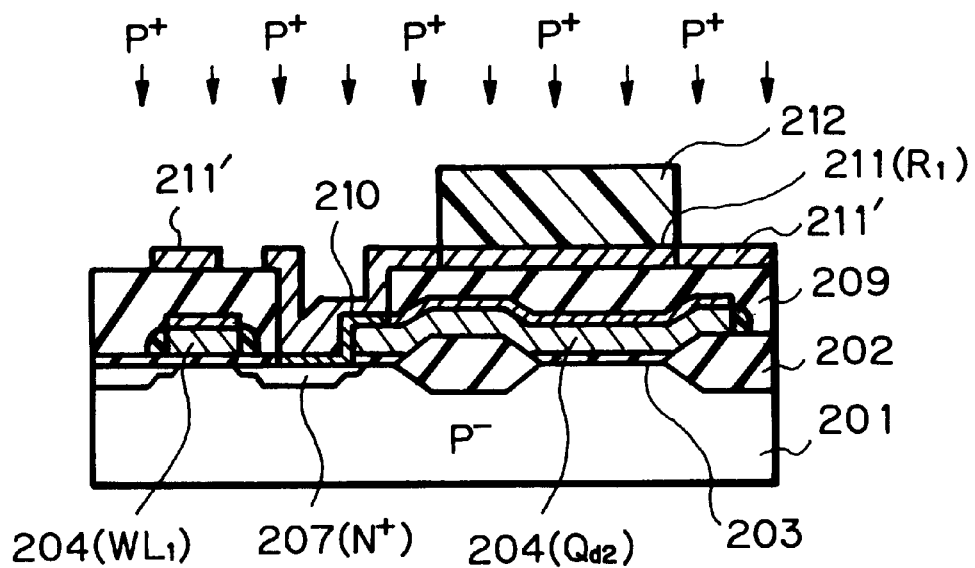

Next, referring to FIG. 7I, a photoresist pattern 212 is formed. Then, about $1 \times 10^{15}$ phosphorus (or arsenic) ions are implanted into the low impurity concentration polycrystalline silicon layer 211. As a result, although the resistance of the polycrystalline silicon layer 211 beneath the photoresist pattern 212 remain high, the other portion of the polycrystalline silicon layer 211 becomes a polycrystalline silicon layer 211' having a low resistance (see FIG. 6B). Then, the photoresist 212 is removed.

Figure 7J:
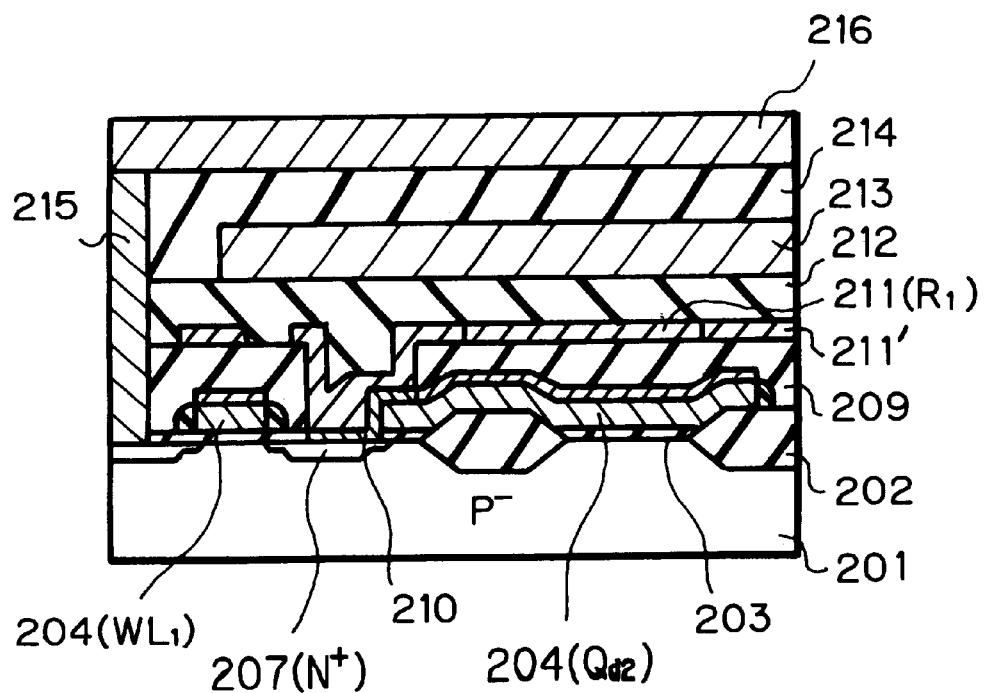

Finally, referring to FIG. 7J, an insulating layer 212 is formed on the entire surface. That is, first, an about 100 nm thick silicon oxide layer is deposited by an APCVD process. Then, an about 600 nm thick BPSG layer is deposited on the silicon oxide layer by an APCVD process. Then, after a heating operation at about 800° C. is carried out, a CMP process is performed upon the BPSG layer, to flatten it.

Then, contact holes $CONT_3$ and $CONT_4$ are perforated in the insulating layer 212 (see FIGS. 6A and 6B). Then, a conductive layer 213 made of aluminum or the like is formed on the insulating layer 211 and is patterned. As a result, the conductive layer 213 is connected as the ground line GND via the contact holes $CONT_3$ and $CONT_4$ to the sources of the drive transistors $Q_{d1}$ and $Q_{d2}$.

Further, an insulating layer 214 is formed on the entire surface. Then, contact holes $CONT_5$ and $CONT_6$ are perforated in the insulating layer 214 (see FIGS. 6A and 6B). Then, metal plugs 215 are buried in the contact holes $CONT_5$ and $CONT_6$. Then, a conductive layer 216 made of aluminum or the like is formed on the insulating layer 214 and is patterned. As a result, the conductive layer 214 is connected as the data lines $DL_1$ and $DL_2$ via the contact holes $CONT_5$ and $CONT_6$ to the drains of the transfer transistors $Q_{t1}$ and $Q_{t2}$.

Thus, the SRAM cell of FIGS. 6A and 6B is completed.

In the SRAM cell as illustrated in FIGS. 5, 6A and 6B and 7A through 7J, since the load resistors $R_1$ and $R_2$ are formed on a different plane from that of the gates of the transistors $Q_{t1}$, $Q_{t2}$, $Q_{d1}$ and $Q_{d2}$, the area of the SRAM cell is decreased, which is advantageous in terms of integration. Also, since the titanium silicide layer 210 is provided between the gate of the drive transistor $Q_{d2}$ ($Q_{d1}$) and the source of the transfer transistor $Q_{t1}$ ($Q_{t2}$) at the nodes $N_1$ ($N_2$), the parasitic resistance at the node $N_1$ ($N_2$) is remarkably reduced, thus increasing the access speed of the SRAM cell of FIG. 5.

Figure 8:
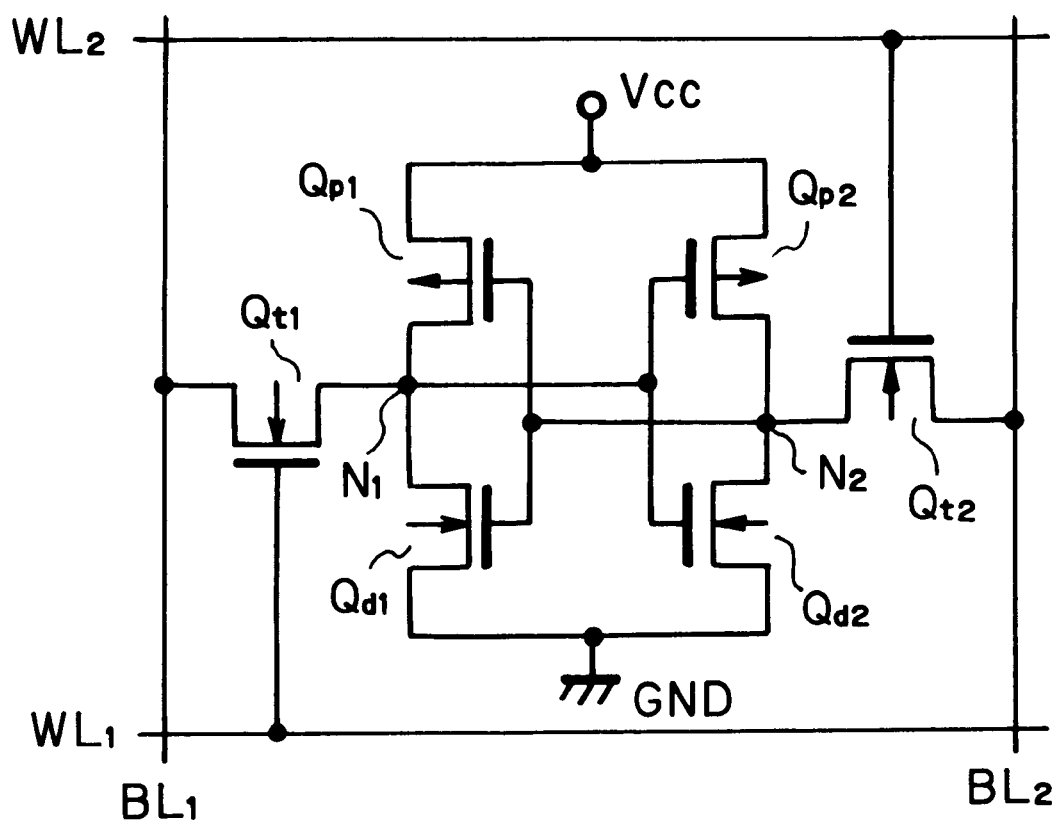
FIG. 8 is an equivalent circuit diagram illustrating a second embodiment of the SRAM cell according to the present invention.

In FIG. 8, which is an equivalent circuit diagram illustrating a second embodiment of the SRAM cell according to the present invention, P-channel thin film transistors (TFTs) $Q_{p1}$ and $Q_{p2}$ are provided instead of the load resistors $R_1$ and $R_2$, respectively, of FIG. 5.

FIGS. 9A and 9B are plan views of the SRAM cell of FIG. 8, and FIGS. 10A through 10M are cross-sectional views taken along the line X—X of FIGS. 9A and 9B. Note that the SRAM cell as illustrated in FIGS. 9A and 9B is symmetrical.

The structure of the SRAM cell of FIG. 8 is explained next with reference to FIGS. 10A through 10J which show manufacturing steps thereof, as well as FIGS. 9A and 9B.

Figure 10A:
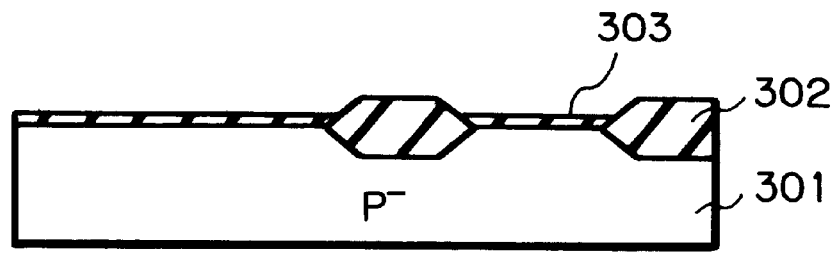
FIGS. 10A through 10M are cross-sectional views of the SRAM cell of FIGS. 9A and 9B.

First, referring to FIG. 10A, in the same way as in FIG. 7A, a P-type monocrystalline silicon substrate 301 is thermally oxidized by a LOCOS process to form an about 400 nm thick field silicon oxide layer 302. As a result, an active area AR (see FIG. 9A) is surrounded by the field silicon oxide layer 302. Then, an about 10 nm thick gate silicon oxide layer 303 is grown by thermally oxidizing the substrate 301.

Figure 10B:
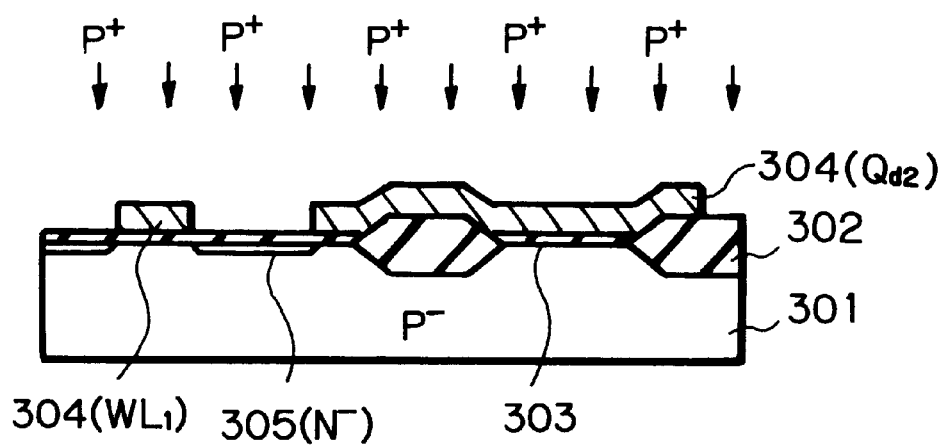

Next, referring to FIG. 10B, in the same way as in FIG. 7B, an about 300 nm thick N-type polycrystalline silicon layer 304 is deposited on the entire surface by a LPCVD process. Then, the polycrystalline silicon layer 304 is patterned by a photolithography process and an anisotropic dry etching process, so that the word lines $WL_1$ and $WL_2$ (i.e., the gates of the transfer transistors $Q_{t1}$ and $Q_{t2}$) and the gates of the drive transistors $Q_{d1}$ and $Q_{d2}$ are formed (see FIG. 9A). Then, about $2 \times 10^{13}$ phosphorus ions per $cm^2$ at an energy of about 10 keV are implanted into the substrate 301 using the polycrystalline silicon layer 304 and the field silicon oxide layer 302 as a mask, so that N⁻-type impurity diffusion regions 305 of an LDD configuration are fomed.

Figure 10C:
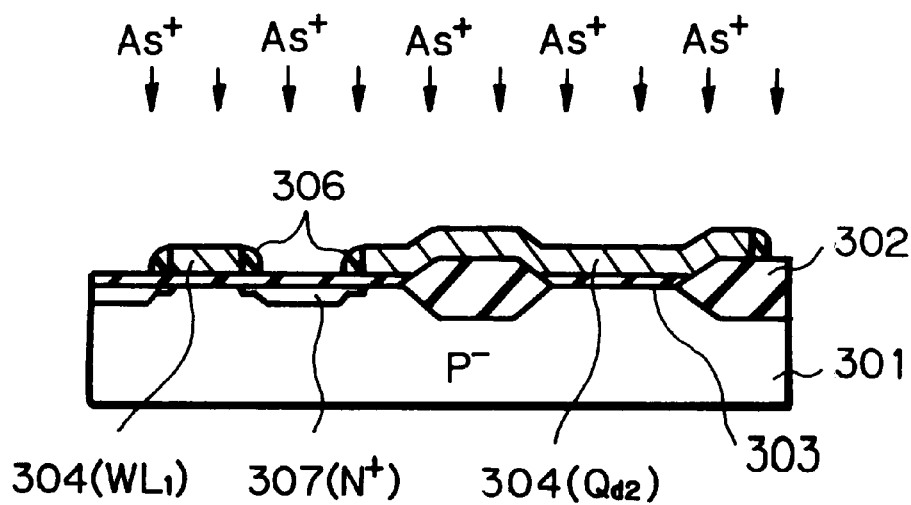

Next, referring to FIG. 10C, in the same way as in FIG. 7C, an about 100 nm thick silicon oxide layer is deposited on the entire surface by an LPCVD process. Then, the silicon oxide layer is etched back by a photolithography process and an anisotropic process to form a sidewall silicon oxide layer 306. Then, about $5 \times 10^{15}$ arsenic ions per cm² are implanted into the substrate 301 by using the sidewall silicon oxide layer 306 as a mask to form N⁺-type impurity diffusion regions 307 of the LDD configuration which have an impurity concentration of about $10^{20}$ to $10^{21}$ per cm³ (see FIG. 9A).

Figure 10D:
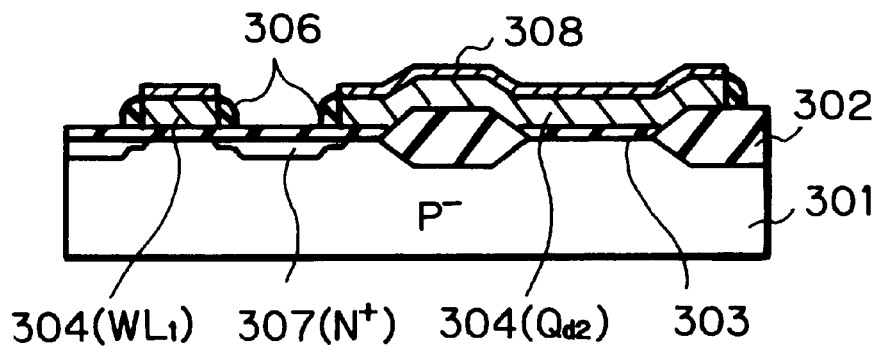

Next, referring to FIG. 10D, in the same way as in FIG. 7D, an about 50 to 60 nm thick titanium layer is deposited on the entire surface by a sputtering process. Then, a heating operation is performed upon the titanium layer at a temperature of lower than 700° C. such as about 650° C. for about 30 seconds, so that the titanium layer is reacted with the polycrystalline silicon layer 304. Then, the unreacted portion of the titanium layer is removed by an alkali solution such as SPM. As a result, a titanium silicide layer 308 is formed only on the polycrystalline silicon layer 304. Then, a heating operation is carried out at a temperature of higher than 800° C. for about 20 seconds to decrease the resistance of the titanium silicide layer 308.

Figure 10E:
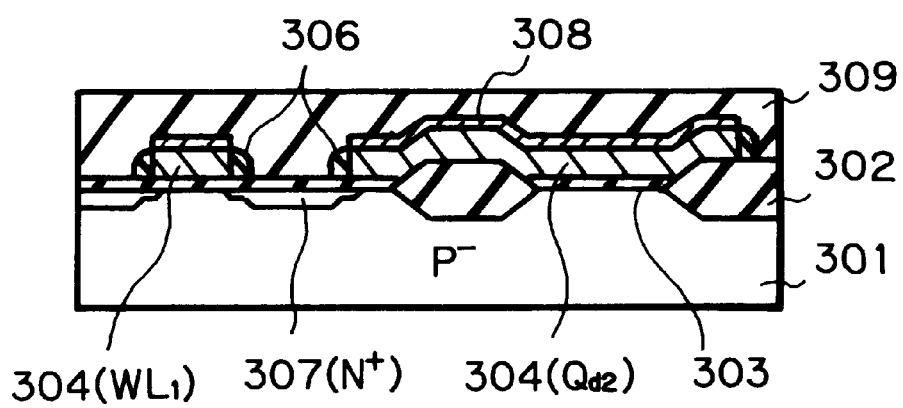

Next, referring to FIG. 10E, in the same way as in FIG. 7E, an insulating layer 309 is formed on the entire surface. That is, first, an about 100 nm thick silicon oxide layer is deposited by an APCVD process. Then, an about 600 nm thick BPSG layer is deposited on the silicon oxide layer by an APCVD process. Then, after a heating operation at about 800° C. is carried out, a CMP process is performed upon the BPSG layer, to flatten it. Then, an about 100 nm thick silicon oxide layer is deposited on the flattened BPSG layer by an APCVD process, thus completing the insulating layer 309.

Figure 10F:
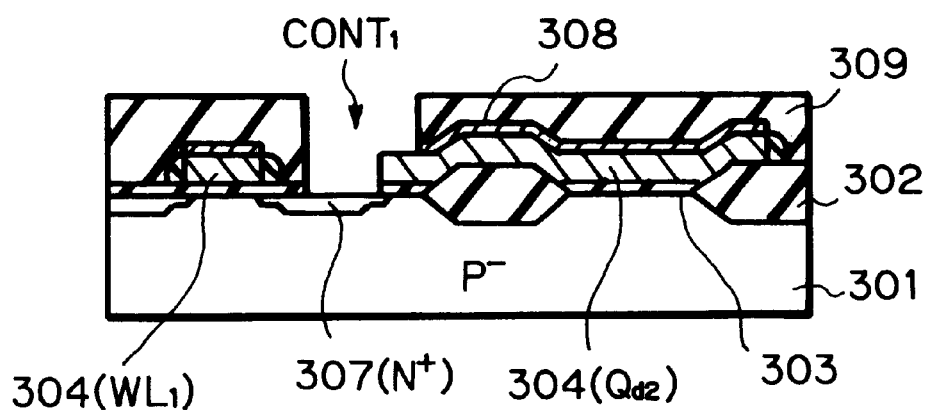

Next, referring to FIG. 10F, in the same way as in FIG. 7F, contact holes $CONT_1$ and $CONT_2$ are perforated in the insulating layer 309 (see FIG. 9A). In this case, in the contact holes $CONT_1$ and $CONT_2$, the gate silicon oxide layer 303 and the sidewall silicon oxide layer 306 are completely etched. However, note that the titanium silicide layer 308 within the contact holes $CONT_1$ and $CONT_2$ can be left by using a high etching ratio etching process of silicon oxide to titanium silicide.

Figure 10G:
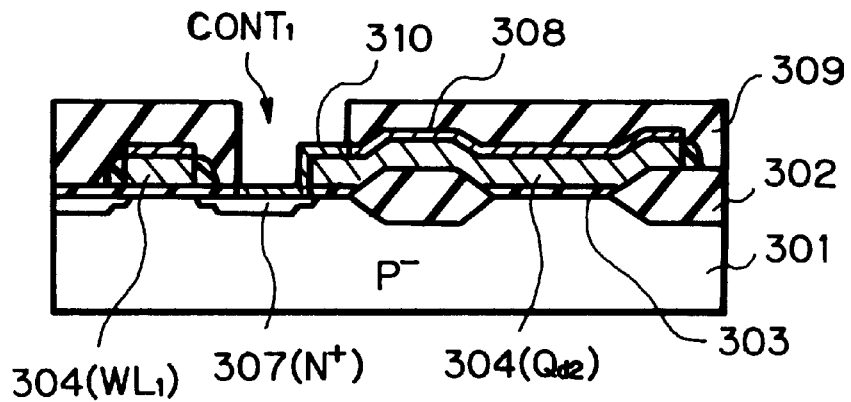

Next, referring to FIG. 10G, in the same way as in FIG. 7G, an about 50 to 60 nm thick titanium layer is deposited on the entire surface by a sputtering process. Then, a heating operation is performed upon the titanium layer at a temperature of lower than 700° C. such as about 650° C. for about 30 seconds, so that the titanium layer is reacted with the N⁺-type impurity region 307 and the polycrystalline silicon layer 304 within the contact holes $CONT_1$ and $CONT_2$. Then, the unreacted portion of the titanium layer is removed by an alkali solution such as SPM. As a result, a titanium silicide layer 310 is formed only within the contact holes $CONT_1$ and $CONT_2$. Then, a heating operation is carried out at a temperature of higher than 800° C. for about 20 seconds to decrease the resistance of the titanium layer 310.

Figure 10H:
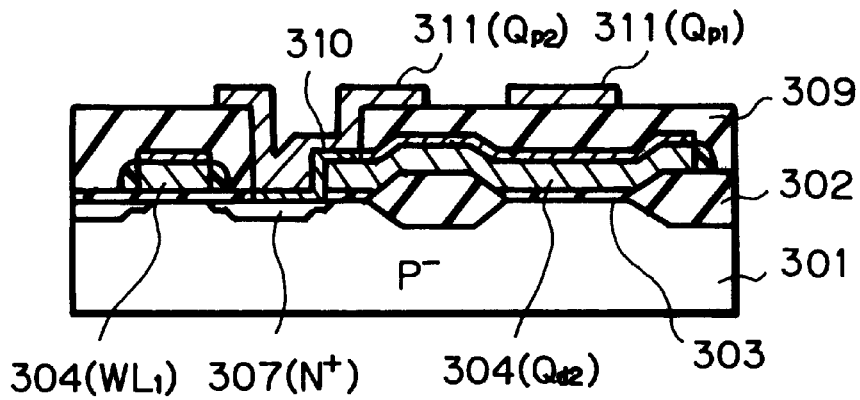

Next, referring to FIG. 10H, an about 50 to 100 nm thick polycrystalline silicon layer 311 is deposited on the entire surface by an LPCVD process. In this case, if the device is in a ammonia plasma atmosphere, nitride is grown on the titanium silicide layer 310, thus preventing active silicon and titanium silicide from reacting with each other when the polycrystalline silicon layer 311 is grown. Then, after about $1 \times 10^{13}$ to $1 \times 10^{15}$ N-type impurity ions per cm² are implanted into the polycrystalline silicon layer 311, the latter is patterned by a photolithography process and an anisotropic dry etching process, to form the gates of the TFTs $Q_{p1}$ and $Q_{p2}$.

Figure 10I:
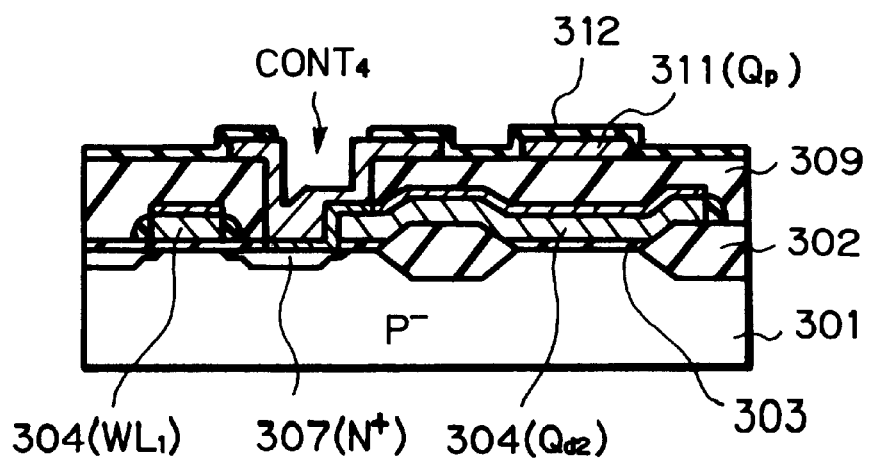

Next, referring to FIG. 10I, an about 5 to 20 nm thick gate silicon oxide layer 313 for the TFTs $Q_{p1}$ and $Q_{p2}$ is deposited on the entire surface by an LPCVD process. Then, contact holes $CONT_3$ and $CONT_4$ (see FIG. 9B) are perforated in the gate silicon oxide layer 313 by an anisotropic etching process. Thus, the gate of the TFTs $Q_{p1}$ and $Q_{p2}$ are exposed by the contact holes $CONT_3$ and $CONT_4$.

Figure 10J:
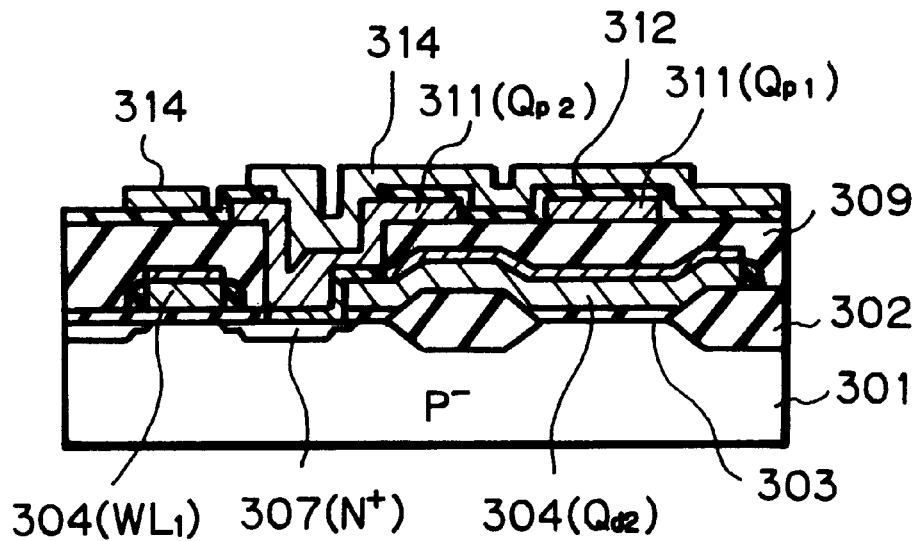

Next, referring to FIG. 10J, an amorphous silicon layer is grown on the entire surface, and a heating operation at about 600° C. is performed upon the amorphous silicon layer. As a result, the amorphous silicon layer is changed into a polycrystalline silicon layer 314. After about $1 \times 10^{12}$ to $10^{13}$ N-type impurities per cm² are implanted into the polycrystalline silicon layer 314, the polycrystalline silicon layer is patterned by an anisotropic dry etching process.

Figure 10K:
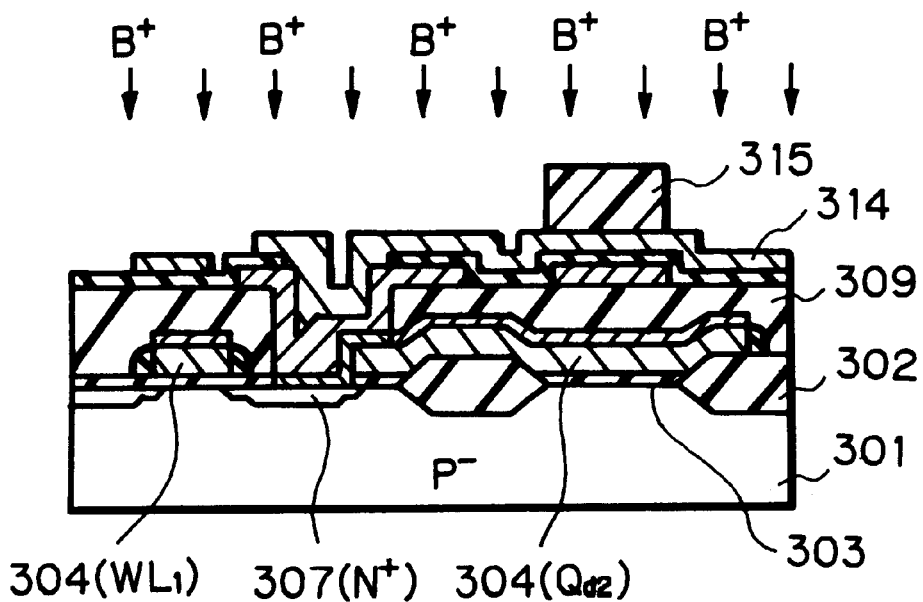
Figure 10L:
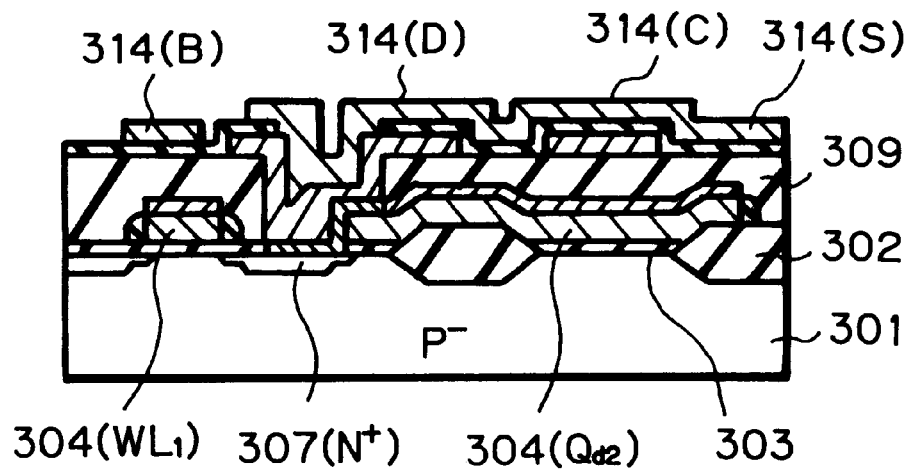

Next, referring to FIG. 10K, a photoresist patte 315 is formed. Then, about 1×1014 to 1015 boron ions (B+ or BF₂+) per cm2 are implanted into the polycrystal line silicon layer 114 by using the photoresist pattern 115 as a mask. Then, the photoresist pattern 315 is removed. As a result, as illustrated in FIG. 10L, the polycrystalline silicon layer 314 is divided into a channel region 314 (C), a source region 314 (S) and a drain region 314 (D) of each of the TFTs $Q_{p1}$ and $Q_{p2}$ (see FIG. 9B).

Figure 10M:
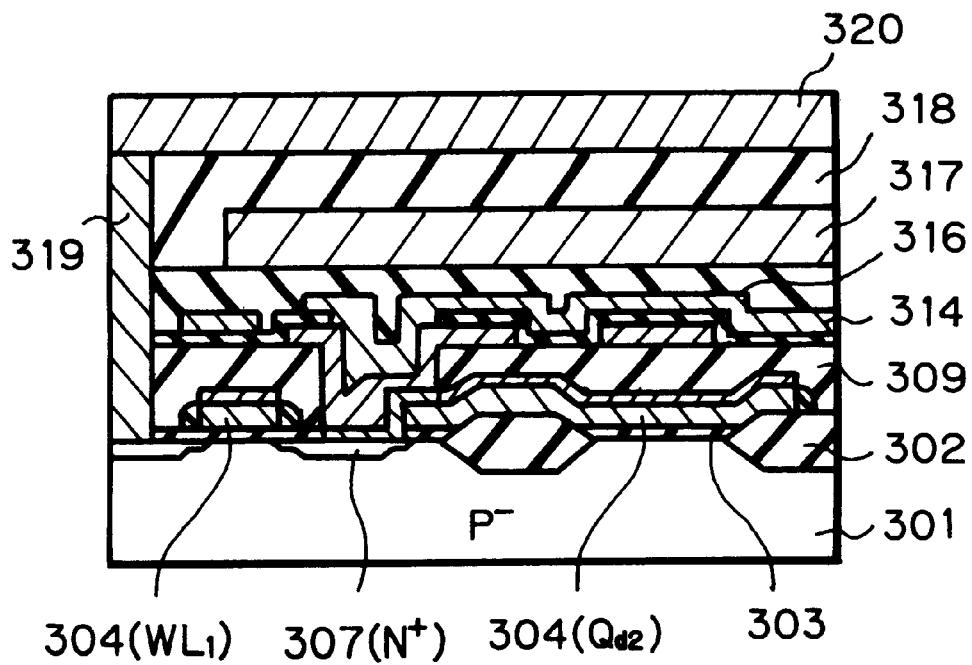

Finally, referring to FIG. 10M, in the same way as in FIG. 7J, an insulating layer 316 is formed on the entire surface. That is, first, an about 100 nm thick silicon oxide layer is deposited by an APCVD process. Then, an about 600 nm thick BPSG layer is deposited on the silicon oxide layer by an APCVD process. Then, after a heating operation at about 800° C. is carried out, a CMP process is performed upon the BPSG layer, to flatten it.

Then, contact holes $CONT_5$ and $CONT_6$ are perforated in the insulating layer 316 (see FIGS. 9A and 9B). Then, a conductive layer 317 made of aluminum or the like is formed on the insulating layer 316 and is patterned. As a result, the conductive layer 317 is connected as the ground line GND via the contact holes $CONT_5$ and $CONT_6$ to the sources of the drive transistors $Q_{d1}$ and $Q_{d2}$.

Further, an insulating layer 318 is formed on the entire surface. Then, contact holes $CONT_7$ and $CONT_8$ are perforated in the insulating layer 318 (see FIGS. 9A and 9B). Then, metal plugs 319 are buried in the contact holes $CONT_7$ and $CONT_8$. Then, a conductive layer 320 made of aluminum or the like is formed on the insulating layer 318 and is patterned. As a result, the conductive layer 320 is connected as the data lines $DL_1$ and $DL_2$ via the contact holes $CONT_7$ and $CONT_8$ to the drains of the transfer transistors $Q_{t1}$ and $Q_{t2}$.

Thus, the SRAM cell of FIGS. 9A and 9B is completed.

In the SRAM cell as illustrated in FIGS. 8, 9A and 9B and 10A through 10K, since the TFTs are formed on a different plane from that of the gates of the transistors $Q_{t1}$, $Q_{t2}$, $Q_{d1}$ and $Q_{d2}$, the area of the SRAM cell is decreased, which is advantageous in terms of integration. Also, since the titanium silicide layer 310 is provided between the gate of the drive transistor $Q_{d2}$ ($Q_{d1}$) and the source of the transfer transistor $Q_{t1}$ ($Q_{t2}$) at the nodes $N_1$ ($N_2$), the parasitic resistance at the node $N_1$ ($N_2$) is remarkably reduced, thus increasing the access speed of the SRAM cell of FIG. 8.

In the above-described second embodiment, the gates of the TFTs are beneath the channel regions thereof, however, the present invention can be applied to an SRAM cell where the gates of TFTs are above the channel regions thereof.

As explained hereinabove, according to the present invention, since the load resistors or the TFTs are formed on a different plane from that of the transfer transistors and the drive transistors, the size of the SRAM cell can be reduced. For example, the area of the SRAM cell can be reduced by about 30 percent as compared with the prior art SRAM cell of FIGS. 1, 2 and 3A through 3H. Also, since the metal silicide layers are formed at the contact nodes, the parasitic resistance thereof can be reduced, thus increasing the access speed of the SRAM cell. For example, the parasitic resistance can be reduced by a factor of hundreds as compared with the prior art SRAM cell of FIG. 4.

I claim:

1. A static memory cell formed in a semiconductor substrate, comprising:

first and second nodes;

a first drive MOS transistor having a drain connected to said first node and a gate connected to said second node;

a second drive MOS transistor having a drain connected to said second node and a gate connected to said first node;

a first transfer MOS transistor having a source connected to said first node;

a second transfer MOS transistor having a source connected to said second node;

a first load element connected to said first node; and a second load element connected to said second node, the drain of said first drive MOS transistor and the source of said first transfer MOS transistor being formed by a first impurity region in said semiconductor substrate, the drain of said second drive MOS transistor and the source of said second transfer MOS transistor being formed by a second impurity region in said semiconductor substrate, said static memory cell further comprising:

a first metal silicide layer formed on said first impurity region and the gate of said second drive MOS transistor; and a second metal silicide layer formed on said second impurity region and the gate of said first drive MOS transistor, said first and second load elements being formed on said first and second metal silicide layers, respectively.

2. The static memory cell as set forth in claim 1, wherein said first and second load elements are resistors.

3. The static memory cell as set forth in claim 2, wherein said resistors are made of polycrystalline silicon.

4. The static memory cell as set forth in claim 1, wherein said first and second load elements are thin film transistors.

5. The static memory cell as set forth in claim 4, wherein said thin film transistors are of a P-channel type, and said first and second drive MOS transistors and said first and second transfer MOS transistors are of an N-channel type.

6. The static memory cell as set forth in claim 1, wherein gates of said first and second drive MOS transistors and said first and second MOS transistors are constructed by a polycrystalline silicon layer and a metal silicide layer formed on said polycrystalline silicon layer.

7. A semiconductor memory device, comprising:

a first drive transistor having a gate and having first and second source/drain regions;

a second drive transistor having a gate coupled to said first source/drain region of said first drive transistor, a first source/drain region coupled to said gate of said first drive transistor, and a second source/drain region coupled to said second source/drain region of said first drive transistor;

a first load element, formed at a substantially different layer of the semiconductor memory device than said first drive transistor and being coupled to said first source/drain region of said first drive transistor at a first contact node;

a second load element, formed at a substantially different layer of the semiconductor memory device than said second drive transistor and being coupled to said first source/drain region of said second drive transistor at a second contact node, wherein said first and second contact nodes each include first and second metal silicide layers, respectively, that facilitate low resistance couplings at the nodes;

a first transfer transistor having a first source/drain area coupled to said first load element via said first metal silicide layer at said first contact node; and a second transfer transistor having a first source/drain area coupled to said second load element via said second metal silicide layer at said second contact node, whereby the metal silicide layers minimize parasitic resistance at said contact nodes, wherein said first transfer transistor is formed at substantially a same layer of the semiconductor memory device as said first drive transistor and said second transfer transistor is formed at substantially a same layer of the semiconductor memory device as said second drive transistor.

8. A semiconductor memory device, according to claim 7, wherein gates of said transfer transistors are coupled to word lines of the semiconductor memory device.

9. A semiconductor memory device, according to claim 7, wherein said first and second load elements are resistors made of polycrystalline silicon.

10. A semiconductor memory device, according to claim 7, wherein said first and second load elements are thin film transistors.

11. A semiconductor memory device, comprising:

a first drive transistor having a gate and having first and second source/drain regions, wherein at least said first source/drain region is formed by a first impurity region;

a second drive transistor having a gate coupled to said first source/drain region of said first drive transistor, a first source/drain region coupled to said gate of said first drive transistor, and a second source/drain region coupled to said second source/drain region of said first drive transistor, wherein at least said first source/drain region of said second drive transistor is formed by a second impurity region separate from said first impurity region;

a first load element, coupled to said first source/drain region of said first drive transistor at a first contact node; and a second load element, coupled to said first source/drain region of said second drive transistor at a second contact node;

a first transfer transistor having a first source/drain area coupled to said first load element and having a second source/drain area formed by said first impurity region; and a second transfer transistor having a first source/drain area coupled to said second load element and having a second source/drain area formed by said second impurity region.

12. A semiconductor memory device, according to claim 11, wherein gates of said transfer transistors are coupled to word lines of the semiconductor memory device.

13. A semiconductor memory device, according to claim 11, wherein said first and second load elements are resistors made of polycrystalline silicon.

14. A semiconductor memory device, according to claim 11, wherein said first and second load elements are thin film transistors.

* * * * *